(12) United States Patent
Kim et al.

(10) Patent No.: US 7,153,002 B2
(45) Date of Patent: Dec. 26, 2006

(54) LENS FOR LED LIGHT SOURCES

(75) Inventors: Jin Jong Kim, Kyunggi-do (KR); Ho Seop Jeong, Kyunggi-do (KR); Sang Hyuck Lee, Kyunggi-do (KR); Joo Hee Jun, Seoul (KR)

(73) Assignee: Samsung Electro-Mechanics Co., Ltd., Kyunggi-Do (JP)

( * ) Notice: Subject to any disclaimer, the term of this patent is extended or adjusted under 35 U.S.C. 154(b) by 54 days.

(21) Appl. No.: 11/155,242

(22) Filed: Jun. 17, 2005

(65) Prior Publication Data

US 2006/0083003 A1   Apr. 20, 2006

(30) Foreign Application Priority Data

Oct. 15, 2004   (KR)   .................. 10-2004-0082746

(51) Int. Cl.
*F21V 5/00* (2006.01)

(52) U.S. Cl. .................. 362/327; 362/305; 362/329
(58) Field of Classification Search ................ 362/327, 362/305, 307, 311; 359/726, 727, 868
See application file for complete search history.

(56) References Cited

U.S. PATENT DOCUMENTS

| 4,478,588 | A | * | 10/1984 | Lockard | ..................... 438/26 |
|---|---|---|---|---|---|
| 5,897,201 | A | | 4/1999 | Simon | |
| 6,607,286 | B1 | * | 8/2003 | West et al. | .................. 362/255 |
| 6,679,621 | B1 | | 1/2004 | West et al. | |
| 6,719,442 | B1 | * | 4/2004 | Chen | .......................... 362/328 |
| 7,006,306 | B1 | * | 2/2006 | Falicoff et al. | ............. 359/800 |
| 7,083,313 | B1 | * | 8/2006 | Smith | ......................... 362/555 |

\* cited by examiner

*Primary Examiner*—Ali Alavi
(74) *Attorney, Agent, or Firm*—Darby & Darby

(57) ABSTRACT

A lens for light emitting diode (LED) light sources which allows light emitted from an LED light source to exit the lens in a direction perpendicular to a vertical center axis of the lens. The lens of the present invention includes an inner space which is defined in a lens body having both a bottom surface and an upper reflective surface, so that light passing through the inner space is partially reflected by total internal reflection on a portion (selective transmission surface, inner reflective surface, inside reflective surface) of a boundary surface between the inner space and the lens body. Thus, light emitted from an LED light source efficiently exits the lens through a side surface. Accordingly, the lens of the present invention is used in efficient display and illumination optical systems.

17 Claims, 9 Drawing Sheets

LENS FOR LED LIGHT SOURCES

The present application claims priority under 35 U.S.C. §119 to Korean Patent Application No. 2004-82746 filed on Oct. 15, 2004. The content of the application is incorporated herein by reference in its entirety.

BACKGROUND OF THE INVENTION

1. Field of the Invention

The present invention relates generally to lenses for LED (light emitting diode) light sources and, more particularly, to a lens for LED light sources which is used in efficient display and illumination optical systems.

2. Description of the Related Art

Recently, in display and illumination optical systems, the needs of light sources which are environmentally-friendly and highly efficient and have long life spans has increased greatly. To achieve the above-mentioned purpose, studies have been conducted to increase the efficiency and brightness of LEDs. Alternative light sources using LEDs have been developed. Such LED light sources are used in display and illumination optical systems. In particular, according to publications of projects, such as environmentally-friendly televisions, studies and developments for LCDs (liquid crystal displays) using the LED light sources have been increasingly promoted. To meet the above-mentioned technical needs, development of more efficient lenses for LED light sources used in displays and illumination devices are required.

The illumination devices or displays using LED light sources use white LEDs or white light to be created by mixing three primary colors (RGB) as light sources. The white LEDs have superior white light realization. However, in the case that the white LEDs are used in displays, because color tone is distinguishable, color reproducibility is deteriorated. Therefore, typically, light sources using RGB are used as light sources for high definition displays.

Figure 1:
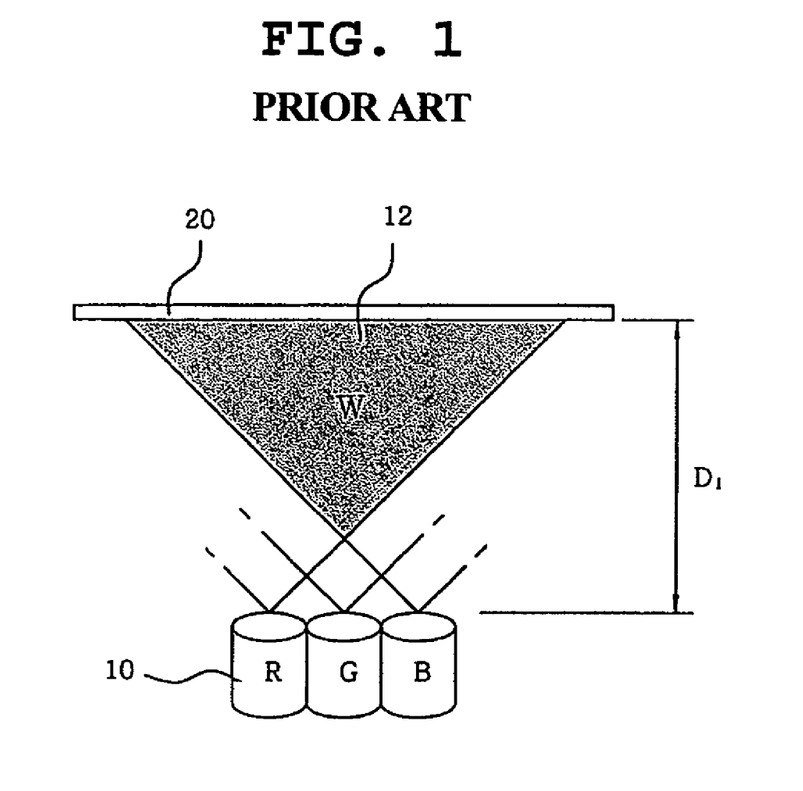
FIG. 1 is a view showing an example of conventional light sources for displays.

FIG. 1 is a view showing an example of conventional light sources for displays. In detail, FIG. 1 shows how to create a white light using an arrangement of LEDs in triple primary colors (RGB).

As shown in FIG. 1, in the case of a display using a triple primary color LED light source 10, because white light (W) is created by mixing LED lights (for example, red, green and blue), a distance ($D_1$, or light emitting distance) from the three primary color LED light source 10 to a screen 20 must be a predetermined value or more. Therefore, the display is increased in thickness.

Figure 2:
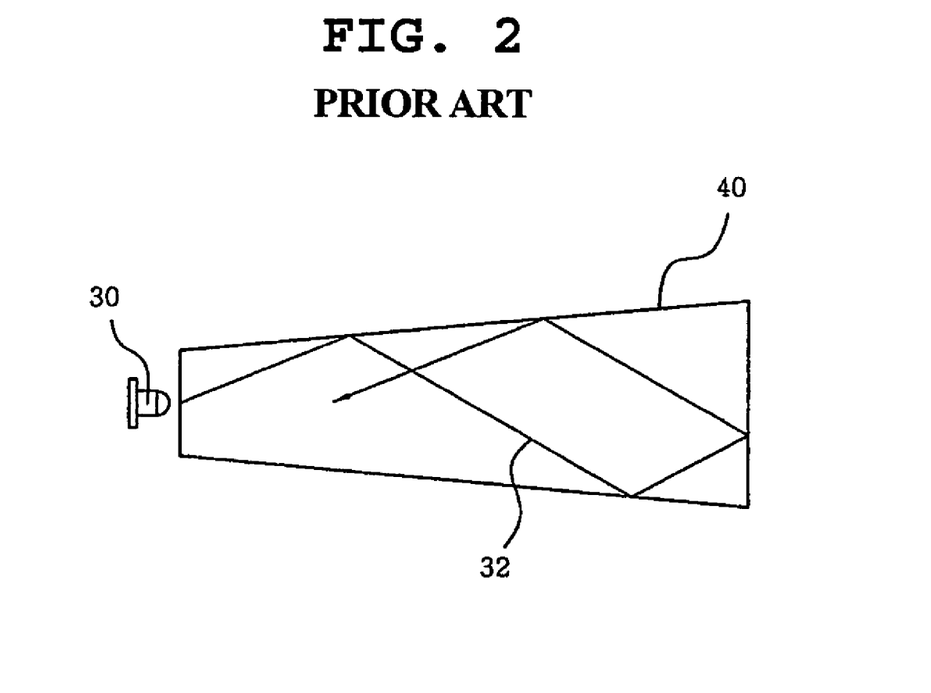
FIG. 2 is a view showing another example of conventional light sources for displays.

FIG. 2 is a view showing another example of conventional light sources for displays. In particular, FIG. 2 shows the case of using a light guide panel 40.

In the case of FIG. 2, an LED 30 is placed on a side of the light guide panel 40. A path 32 of light emitted from the LED 30 is defined in the light guide panel 40 and the light is repeatedly reflected by a boundary surface of the light guide panel 40. Therefore, a display having superior uniformity and color adjusting ability can be embodied. However, it is difficult to apply the case of FIG. 2 to a large screen display. As well, the case of FIG. 2 is disadvantageous in that light efficiency is reduced.

In an effort to overcome the above-mentioned problems, lenses which allow light emitted from an LED light source to exit the lens in a circumferential direction were disclosed. A representative example of such lenses was proposed in U.S. Pat. No. 6,679,621, in which a side-emitting type LED and a lens having a reflective surface and a refractive surface are provided. The lens disclosed in U.S. Pat. No. 6,679,621 is characterized in that light emitted from the LED exits the lens through a side surface which is the refractive surface. Another example of lenses having the above-mentioned structure is shown in FIG. 3.

Figure 3:
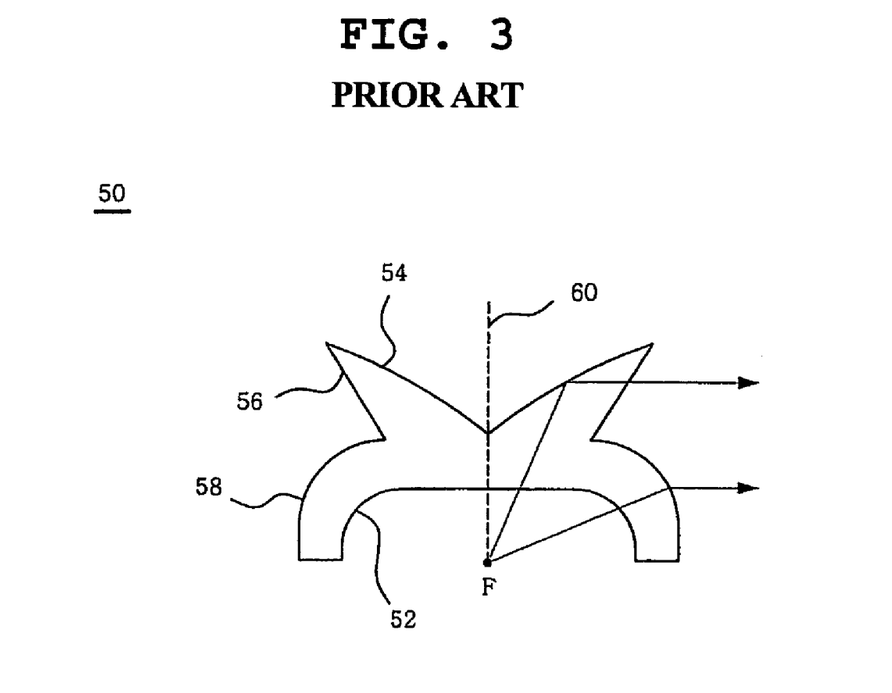
FIG. 3 is a view showing a conventional side-emitting type lens for LED light sources.

A lens 50 of FIG. 3 includes a bottom surface 52, a reflective surface 54, a first refractive surface 56 which is angled with respect to a center axis 60 of the lens 50, and a second refractive surface 58 which extends from the bottom surface 52 to the first refractive surface 56. Part of the light entering the lens 50 from a focal point (F) of the bottom surface 52 is reflected by the reflective surface 54 and exits the lens 50 through the first refractive surface 56. The remainder of the light exits the lens 50 through the second refractive surface 58.

In the lens 50 of FIG. 3, most light exits the lens 50 through the side surface of the lens 50 which comprises the first and second refractive surfaces. As such, the lens 50 of FIG. 3 is characterized in that light from the LED light source is emitted through the side surface. However, because the single reflective surface 54, which is symmetrical around the center axis 60 of the lens 50, is only used to guide light to the side surface of the lens 50, if the lens 50 is applied to a relatively large LED light source to increase in brightness, some light is not emitted through the side surface, but undesirably passes over an upper portion of the lens 50. Therefore, when the lens 50 of FIG. 3 is used in a display, difficulty in providing uniform light exists.

SUMMARY OF THE INVENTION

Accordingly, the present invention has been made keeping in mind the above problems occurring in the prior art, and an object of the present invention is to provide a lens for LED light sources which increases the efficiency of light exiting the lens in a side direction.

In an aspect, the present invention provides a lens for LED (light emitting diode) light sources, including: a lens body, having a bottom surface, an upper reflective surface being symmetrical around a center axis of the lens and angled with respect to the center axis, and a side surface extending from an edge of the upper reflective surface to an edge of the bottom surface; and an inner space defined in the lens body and being symmetrical around the center axis of the lens, with an inner reflective surface provided on at least a portion of a boundary surface of the inner space while being symmetrical around the center axis of the lens and inclined at a predetermined angle, so that light entering the lens from an LED light source through the bottom surface is reflected by the upper reflective surface or the inner reflective surface and exits the lens through the side surface in a direction substantially perpendicular to the center axis of the lens.

The lens may further include a lower reflective surface having a predetermined curvature and provided on a part of the bottom surface other than a part of the bottom surface through which the light of the LED light source enters the lens. The lower reflective surface is symmetrical around the center axis of the lens, so that part of the light reflected by the inner reflective surface is reflected by the lower reflective surface and exits the lens through the side surface.

The inner space may include therein a region through which the center axis of the lens passes. The lens may further include a selective transmission surface provided on a central portion of a lower boundary surface of the inner space to reflect part of the light entering the lens through the bottom surface.

The selective transmission surface may comprise a plane perpendicular to the center axis of the lens. Alternatively, the selective transmission surface may be formed as a dome, pyramid or trapezoid shape to vary an incident angle of light striking the upper reflective surface.

The inner space may be configured as a ring shape in a part other than a region through which the center axis of the lens passes. The lens may further include an inside reflective surface provided on an inside boundary surface of the inner space while being symmetrical around the center axis of the lens and inclined at a predetermined angle, so that part of the light entering the lens through the bottom surface is sequentially reflected by the inside reflective surface and the upper reflective surface and exits the lens through the side surface.

In another aspect, the present invention provides a lens for LED (light emitting diode) light sources, including: a lower lens unit comprising a bottom surface coupled to an LED light source; and an upper lens unit stacked on and coupled to the lower lens unit, and comprising an upper reflective surface being symmetrical around a center axis of the lens and angled with respect to the center axis. The upper lens unit and the lower lens unit are coupled to define between them an inner space being symmetrical around the center axis of the lens, and at least a portion of an upper surface of the lower lens unit, which is in contact with the inner space, forms an inner reflective surface being symmetrical around the center axis of the lens and inclined at a predetermined angle, so that part of light entering the lens from the LED light source through the bottom surface is reflected by the upper reflective surface and exits the lens through the upper lens unit in a direction substantially perpendicular to the center axis of the lens, and another part of the light entering the lens from the LED light source through the bottom surface is reflected by the inner reflective surface and exits the lens through the lower lens unit in a direction substantially perpendicular to the center axis of the lens.

The light in the lens may be reflected by total internal reflection.

The lens may further include at least one protrusion and one corresponding stopper provided on a lower surface of the upper lens unit and the upper surface of the lower lens unit, so that the upper lens unit and the lower lens unit are coupled to each other by engagement of the protrusion and the stopper.

The protrusion and the stopper may be bonded together by an adhesive material interposed between them.

The lens may further include a selective transmission surface provided on a central portion of the upper surface of the lower lens unit, through which light passes, so that part of the light entering the lens from the LED light source through the bottom surface is reflected by the selective transmission surface.

The lens may further include a lower reflective surface having a predetermined curvature and provided on the bottom surface of the lower lens unit. The lower reflective surface is symmetrical around the center axis of the lens, so that part of the light reflected by the selective transmission surface is reflected by the lower reflective surface.

In a further aspect, the present invention provides a lens for LED (light emitting diode) light sources, including: a lower lens unit comprising a bottom surface coupled to an LED light source; and an upper lens unit stacked on and coupled to the lower lens unit, and comprising an upper reflective surface being symmetrical around a center axis of the lens and angled with respect to the center axis. The upper lens unit and the lower lens unit are coupled to define between them an inner space having a ring shape. The lens further includes an inside reflective surface provided on an inside boundary surface of the inner space, so that part of light entering the lens from the LED light source through the bottom surface is reflected by the inside reflective surface and exits the lens in a direction substantially perpendicular to the center axis of the lens.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Hereinafter, embodiments of the present invention will be described in detail with reference to the accompanying drawings.

Reference now should be made to the drawings, in which the same reference numerals are used throughout the different drawings to designate the same or similar components.

Figure 4:
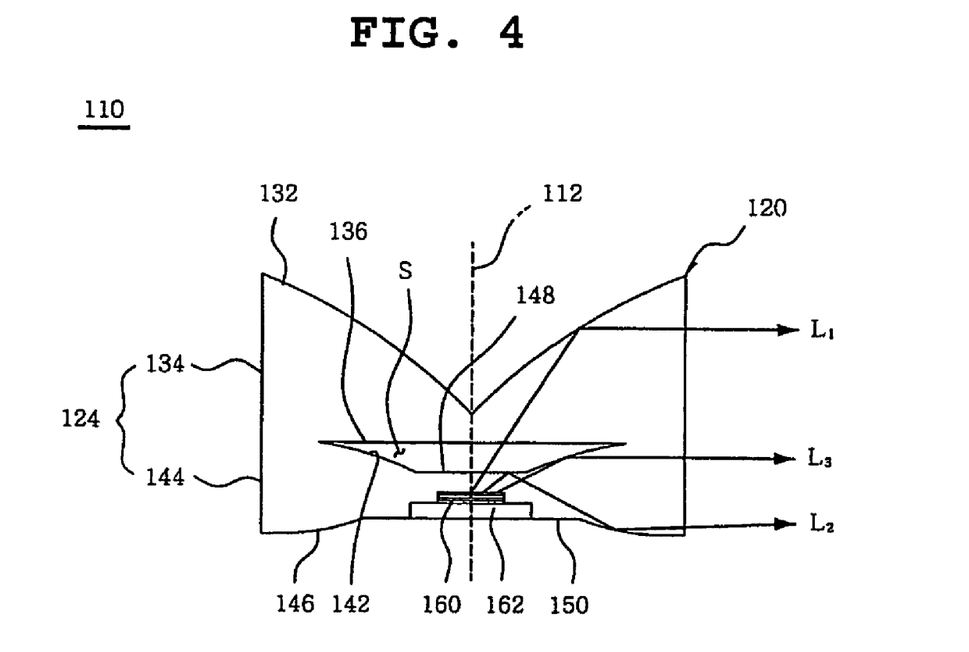
FIG. 4 is a sectional view of a lens for LED light sources, according to an embodiment of the present invention.
Figure 5:
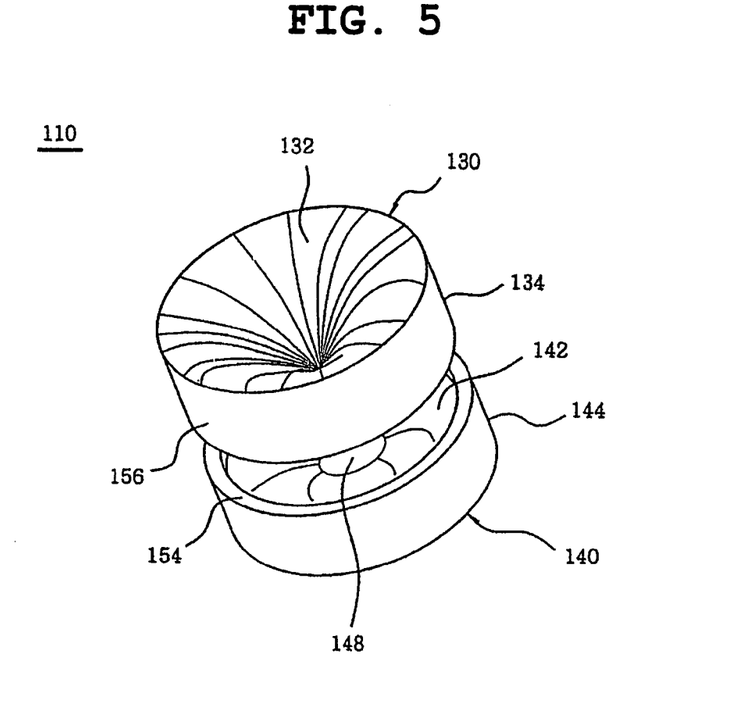
FIG. 5 is an exploded perspective view of the lens of FIG. 4.

FIG. 4 is a sectional view of a lens 110 for LED light sources, according to an embodiment of the present invention. FIG. 5 is an exploded perspective view of the lens 110 of FIG. 4.

The lens 110 for LED light sources according to the present embodiment of the invention includes a lens body 120. The lens body 120 has a bottom surface 150, an upper reflective surface 132 which is symmetrical around a center axis 112 of the lens 110 and angled with respect to the center axis 112, and a side surface 124 which extends from an edge of the upper reflective surface 132 to an edge of the bottom surface 150. The lens 110 further includes an inner space (S) which is defined in the lens body 120 and is symmetrical around the center axis 112 of the lens 110. An inner reflective surface 142 is provided on at least a portion of a boundary surface of the inner space (S), for example, on at least a portion of a lower boundary surface of the inner space (S) while being symmetrical around the center axis 112 of the lens 110 and inclined at a predetermined angle. As such, the lens 110 of the present invention includes the upper reflective surface 132 in addition to the inner reflective surface 142, so that part of the light emitted from an LED light source 160 is reflected by the upper reflective surface 132 and another part of the light is reflected by the inner reflective surface 142 to exit the lens 110 through the side surface 124.

The lens 110 further includes a selective transmission surface 148 which is provided inside the inner reflective surface 142, that is, on a region of the lower boundary surface of the inner space (S), through which the center axis 112 of the lens 110 passes. The selective transmission surface 148 reflects the part of the light which enters the lens 110 from the LED light source 160 through the bottom surface 150. The lens 110 further includes a lower reflective surface 146 which has a predetermined curvature and is provided on a part of the bottom surface 150 other than a central portion of the bottom surface 150, to which the LED light source 160 is coupled. The lower reflective surface 146 is symmetrical around the center axis 112 of the lens 110. The selective transmission surface 148 admits part of the light entering the lens 110 from the LED light source 160 and reflects the remainder of the light according to incidence angles of the incident light, on the basis of a difference in the refractive index between two mediums (for example, a lens body 120 and air) which are in contact with each other at the selective transmission surface 148.

Part of the light, emitted from the LED light source 160, passing through the selective transmission surface 148 continuously passes through an upper boundary surface 136 of the inner space (S) and, thereafter, is reflected by the upper reflective surface 132 and exits the lens 110 through the side surface 124. According to an inclination angle of the upper reflective surface 132, most of the light striking the upper reflective surface 132 is reflected by the upper reflective surface 132 and exits the lens 110 through an upper side surface 134 of the side surface 124 (see, the arrow $L_1$ of FIG. 4).

Another part of the light of the LED light source 160, which is reflected by the selective transmission surface 148 but does not pass through the selective transmission surface 148, is reflected by the lower reflective surface 146 and exits the lens 110 through a lower side surface 144 of the side surface 124 (see, the arrow $L_2$ of FIG. 4) or directly exits the lens 110 through the side surface 124.

The other part of the light of the LED light source 160, which is not incident upon the selective transmission surface 148, is reflected by the inner surface 142 and exits the lens 110 through the side surface 124, that is, through the lower side surface 124 (see, the arrow $L_3$ of FIG. 4). Alternatively, the light, reflected by the inner surface 142, may be again reflected by the lower reflective surface 146 to exit the lens 110 through the side surface 124.

As such, in the present embodiment, the inner reflective surface 142 and the selective transmission surface 148 serve to define the inner space (S) in the lens body 120. In other words, portions of the boundary surface of the inner space (S) are used as the inner reflective surface 142 and the selective transmission surface 148.

In detail, because light striking the lower boundary surface of the boundary surface of the inner space (S) passes from the lens body 120 having a high refractive index to the inner space (air) having a low refractive index, the lower boundary surface can serve as the inner reflective surface 142 and the selective transmission surface 148. On the other had, because light striking the upper boundary surface of the boundary surface of the inner space (S) passes from the inner space (air) having a low refractive index to the lens body 120 having a high refractive index, most of the light passes through the upper boundary surface without being reflected. As such, due to the inner space (S) defined in the lens body 120, the present invention has the inner reflective space 142 and the selective transmission surface 148 as well as the upper reflective surface 132, thus increasing the amount of light exiting the lens 110 through the side surface 124.

In the lens 110 of the present invention having the above-mentioned structure, light is reflected by total internal reflection (TIR) on the boundary surfaces between air and a material constituting the lens 110, that is, on the upper reflective surface 132, the inner reflective surface 142, the selective transmission surface 148 and the lower reflective surface 146.

Typically, light is refracted when it passes from one medium to another medium having different properties. According to the kinds of the two mediums and an incident angle of the light, all of the light is reflected without refraction. This reflection is called total internal reflection or total reflection. Conditions for occurrence of total internal reflection are as follows.

First, light passes from a medium having a high refractive index to another medium having a low refractive index.

Second, an incident angle of the light striking a boundary surface between the two mediums is greater than a critical angle.

The critical angle ($\theta_c$) is determined by the refractive indices of the two mediums, that is, according to Snell's law.

On the assumption that the two mediums are glass and air, the refractive index of the glass is denoted as a factor $n_1$, index of the air is denoted as a factor $n_2$, an incident angle on the glass is the critical angle ($\theta_c$), and a refractive angle on the air is 90°, when the above-mentioned reference variable are set according to Snell's law, the following equation 1 is obtained.

$$n_1 \sin \theta_c = n_2 \sin 90° \qquad \text{[Equation 1]}$$

If equation 1 is arranged with respect to the critical angle ($\theta_c$), the following equation 2 is obtained.

$$\theta_c = \sin^{-1}\frac{n_2}{n_1} \qquad \text{[Equation 2]}$$

Because the relative reflective index of air to glass is approximately 1.50, if this value is used in the above equations, it will be understood that the critical angle of the boundary surface between the air and the glass is about 42°.

As such, in consideration of the kinds (refractive indices) of the two mediums and the incident angle of light, the appropriate inclination and curvature of each of the upper reflective surface 132, the inner reflective surface 142, the selective transmission surface 148 and the lower reflective surface 146 are obtained. Therefore, the reflective surfaces are formed in appropriate shapes according to the properties of the material constituting the lens 110 for LED light sources (more particularly, lens body 120).

Preferably, the lens 110 of the present invention is divided into an upper lens unit 130 and a lower lens unit 140. For example, to form the lens 110 of the present invention, the upper lens unit 130 having the upper reflective surface 132 is stacked on and coupled to the lower lens unit 140 having the bottom surface 150, to which the LED light source 160 is coupled. FIG. 5 shows a means for coupling the upper and lower lens units 130 and 140, such as a stopper 156, formed on an edge of a lower end of the upper lens unit 130, and a protrusion 154, formed on an edge of an upper end of the lower lens unit 140.

Figure 6A:
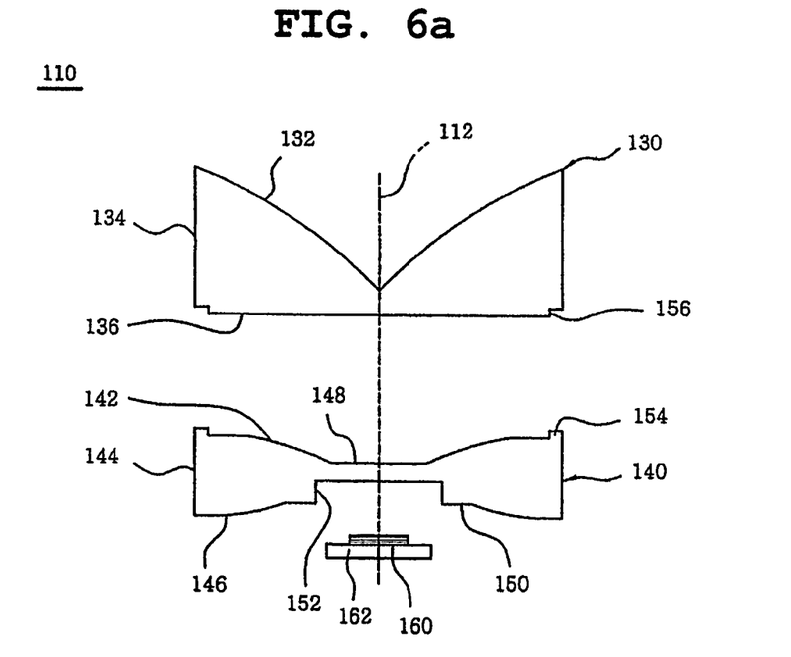
FIG. 6a is a view to illustrate an example of the coupling of upper and lower lens units of FIG. 5.
Figure 6B:
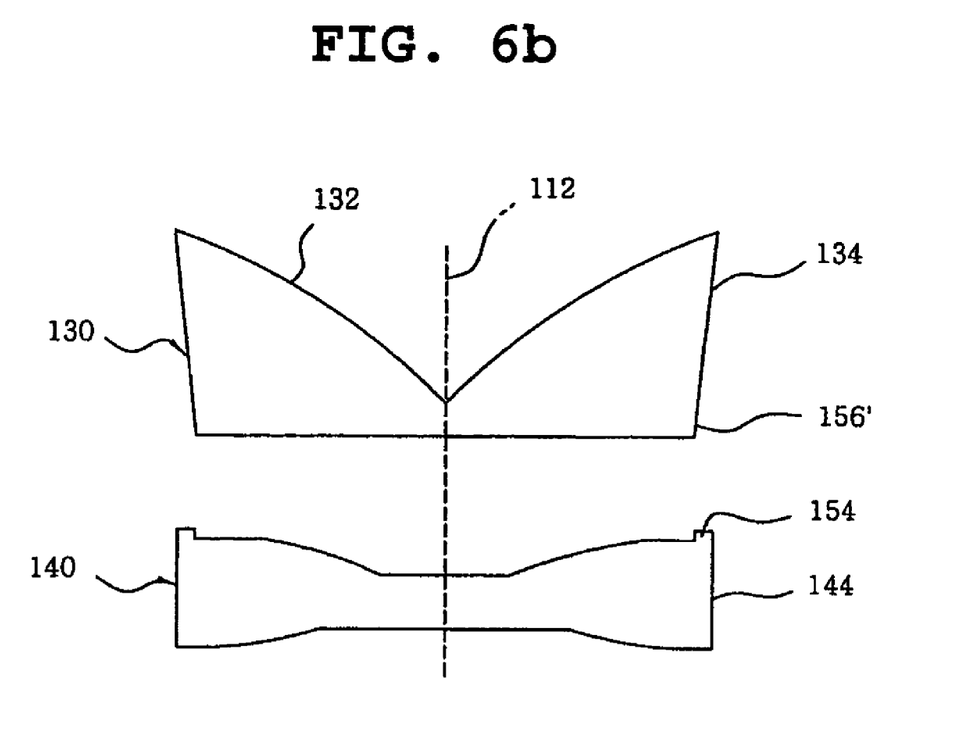
FIG. 6b is a view to illustrate another example of the coupling of upper and lower lens units of FIG. 5.
Figure 6C:
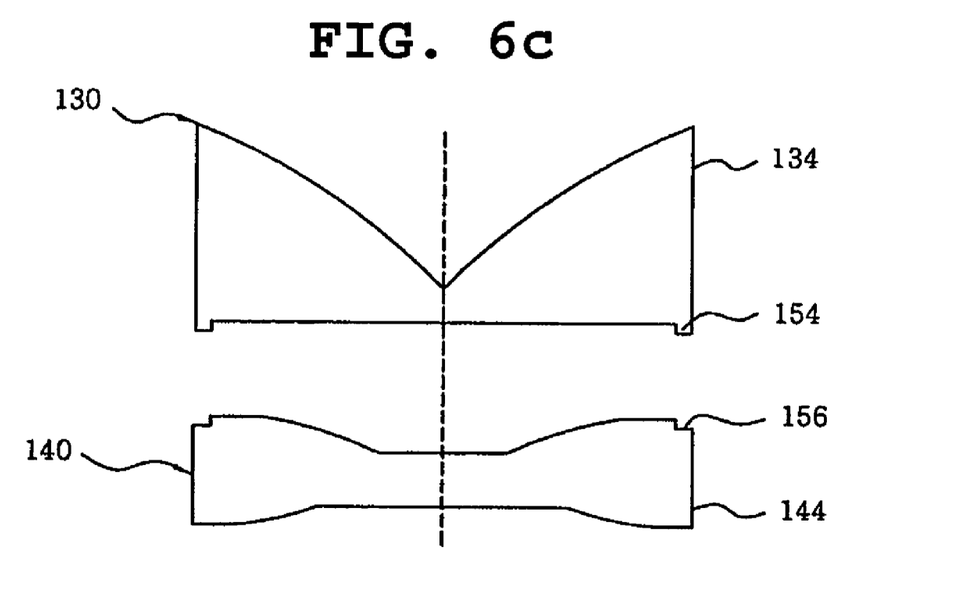
FIG. 6c is a view to illustrate a further example of the coupling of upper and lower lens units of FIG. 5.

FIGS. 6a through 6c are views to illustrate examples of coupling the upper and lower lens units 130 and 140. The coupling of the lens 110 will be described herein below in detail, with reference to FIGS. 6a through 6c.

FIG. 6a shows an example of coupling the upper and lower lens units 130 and 140, in which the stopper 156 provided on the upper lens unit 130 engages with the protrusion 154 provided on the lower lens unit 140.

As shown in FIG. 6a, the lower lens unit 140 includes a coupling depression 152 to receive therein the LED light source 160, and the bottom surface 150 which has the lower reflective surface 146 on the circumference of the coupling depression 152. The lower lens unit 140 further includes the selective transmission surface 148 which is opposite to the coupling depression 152, and the inner reflective surface 142 which is symmetrical based on the selective transmission surface 148. The lower lens unit 140 further includes the lower side surface 144 which extends from an edge of the inner reflective surface 142 to an edge of the lower reflective surface 146.

The upper lens unit 130 is stacked on and coupled to the lower lens unit 140. In detail, the upper lens unit 130 includes a lower surface 136 which faces the selective transmission surface 148 while being spaced apart from the selective transmission surface 148 by a predetermined distance. The upper lens unit 130 further includes the upper reflective surface 132 which is symmetrical around the center axis 112 of the lens 110 and angled with respect to the center axis 112, and the upper side surface 134 which extends from an edge of the upper reflective surface 132 to an edge of the lower surface 136.

The upper and lower lens units 130 and 140 and the LED light source 160, coupled to the bottom surface 150 of the lower lens unit 140, have the same center axis 112 and are assembled together. The selective transmission surface 148 and the inner reflective surface 142 of the lower lens unit 140 and the lower surface 136 of the upper lens unit 130 define the inner space (s) in the lens body 120 (see, FIG. 4) while the upper and lower lens units 130 and 140 are coupled to each other.

The stopper 156 is provided on the edge of the lower end of the upper lens unit 130. The protrusion 154 is provided on the edge of the upper end of the lower lens unit 140. The protrusion 154 and the stopper 156 engage with each other, such that the upper lens unit 130 is stacked on and coupled to the lower lens unit 140, thus forming the single lens body 120 (see, FIG. 4).

The protrusion 154 and the stopper 156 are opposite to and engage with each other. One or more pairs of protrusions 154 and stoppers 156 may be provided along the edge of the junction of the lower and upper lens units 140 and 130. Preferably, as shown in FIG. 5, the protrusion 154 and the stopper 156 are configured as ring shapes along the edges of the lower and upper lens units 140 and 130, respectively.

Furthermore, an adhesive material may be interposed between the protrusion 154 and the stopper 156 to bond the upper lens unit 130 to the lower lens unit 140. In this case, the adhesive material preferably has a refractive index equal to the refractive index of the upper and lower lens units 130 and 140. For example, if each of the upper and lower lens units 130 and 140 is made of glass, the adhesive material may be made of epoxy resin having the same refractive index as that of the glass.

The coupling depression 152 is formed on the center of the bottom surface 150 of the lower lens unit 140. The LED light source 160 which is provided on a substrate 162 is inserted into the coupling depression 152. The substrate 162 of FIG. 6 is configured as a shape suitable to engage with the coupling depression 152. However, alternatively, the substrate 162 may be configured as a shape to support thereon the whole lower lens unit 140. Preferably, the substrate 162, on which the LED light source 160 is provided, and the coupling depression 152 of the lower lens unit 140 are sealed and bonded together by another adhesive material or a filling material interposed between them in the same manner as that described for the coupling of the protrusion 154 and the stopper 156 using the adhesive material. The adhesive material or the filling material also has the same refractive index as that of the upper and lower lens units 130 and 140.

FIGS. 6b and 6c illustrate other examples of the coupling of upper and lower lens units 130 and 140 of FIG. 5. FIG. 6b illustrates a protrusion 154 provided on an upper end of a lower side surface 144 of a lower lens unit 140, so that a lower end 156' of an upper side surface 134 of an upper lens unit 130 is inserted inside the protrusion 154 of the lower lens unit 140 to couple the upper lens unit 130 to the lower lens unit 140. Of course, alternatively, the protrusion 154 may be provided on the upper lens unit 130 so that the upper end of the lower lens unit 140 is inserted into the protrusion 154 of the upper lens unit 130.

FIG. 6c illustrates a protrusion 154 provided under a lower end of an upper side surface 134 of an upper lens unit 130, and a stopper 156 provided on an upper end of a lower side surface 144 of a lower lens unit 140, unlike the lens 110 of FIG. 6a. Thus, the upper lens unit 130 is coupled to the lower lens unit 140 by the engagement of the protrusion 154 and the stopper 156.

Figure 7:
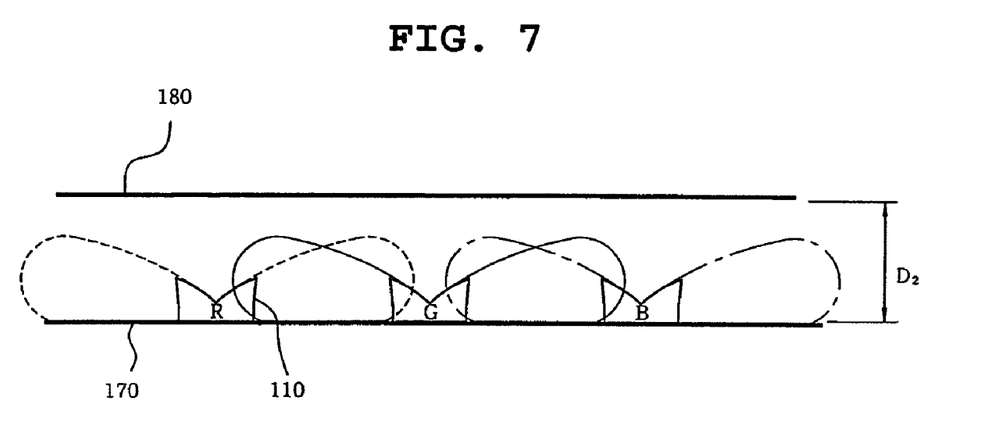
FIG. 7 is a sectional view showing a light source for displays using the lens of FIG. 4.

FIG. 7 is a sectional view showing a light source for displays using the lens 110 of the present invention. In the light source for displays shown in FIG. 7, the lens 110 according to the present embodiment is used. As shown in FIG. 7, the lens 110 of the present invention, which is attached to a substrate 170, can largely reduce a light emission distance in comparison with a conventional light source 10 for displays (see, FIG. 1). Therefore, a display device using the lens 110 of the present invention reduces by distance ($D_2$) from the LED light source to a screen 180 for display, thus significantly reducing a thickness of the display.

Furthermore, the light source for displays of FIG. 7 emits relatively even light to the screen 180. Therefore, even when the lens 110 of the present invention is used in a large screen display, light efficiency is not deteriorated.

Figure 8:
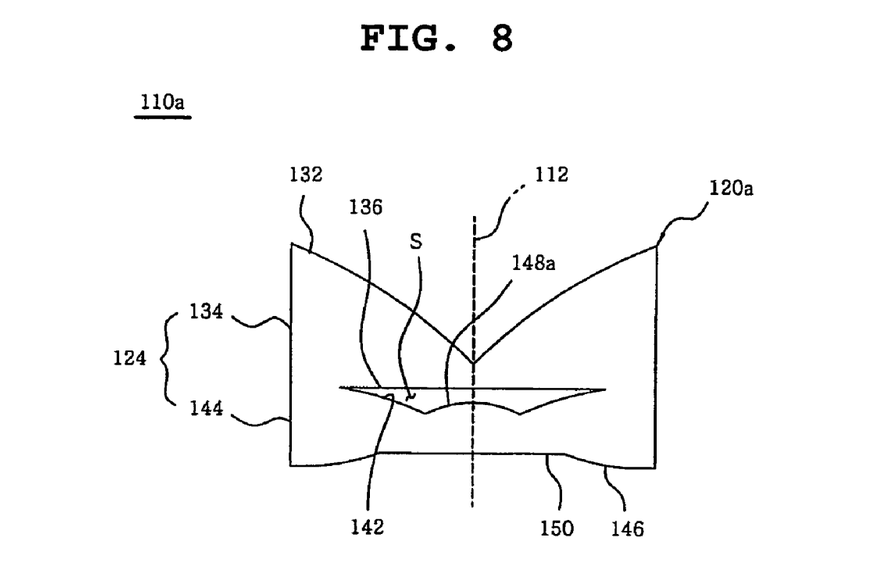
FIG. 8 is a sectional view of a lens for LED light sources, according to a first modification of the embodiment of FIG. 4.
Figure 9:
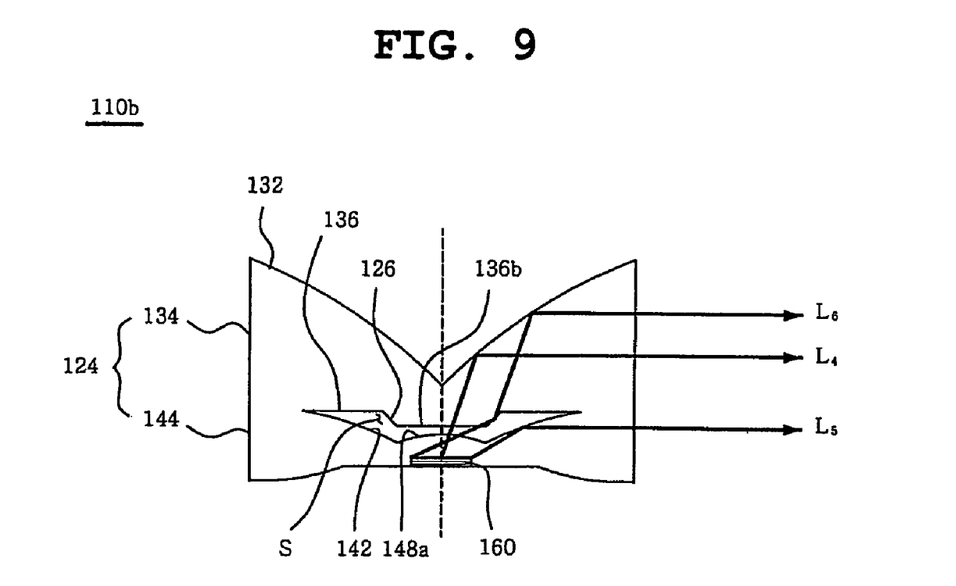
FIG. 9 is a sectional view of a lens for LED light sources, according to a second modification of the embodiment of FIG. 4.

FIG. 8 is a sectional view of a lens 110a for LED light sources, according to a first modification of the present embodiment of FIG. 4. FIG. 9 is a sectional view of a lens 110b for LED light sources, according to a second modification of the present embodiment of FIG. 4. The lens 11a of FIG. 8 is characterized in that a selective transmission surface 148a has a predetermined shape different from the lens 110 of FIG. 4. In detail, the selective transmission surface 148a of FIG. 8 has a dome shape curved toward an inner space (S). As such, the selective transmission surface 148a is convex, so that the proportion of reflected light emitted from an LED light source 160 is different from that of the selective transmission surface 148 having a planar shape (see. FIG. 4). In addition, an incident angle of light striking an upper reflective surface 132 can be changed according to the shape of the selective transmission surface 148a. For example, the selective transmission surface 148a may be formed as a pyramid or trapezoid shape as well as the dome shape shown in FIG. 8.

The lens 110b of FIG. 9 is characterized in that a central portion of a lower surface 136 of an upper lens unit 130 protrudes towards an inner space (S), unlike the lens 110a of FIG. 8. Due to the protruding surface 136b, some light having a large incident angle entering the upper lens unit 130 from a lower lens unit 140 is internally reflected. That is, the protruding surface 136b serves to adjust an angle of the light striking an upper reflective surface 132 of the upper lens unit 130. In detail, a boundary surface extending from the protruding surface 136b to the lower surface 136 comprises an inside reflective surface 126. Thus, the light having a large incident angle is reflected by the inside reflective surface 126 and, thereafter, it is incident upon the upper reflective surface 132 to exit the lens 110b through a side surface 124.

In the lens 110b having the above-mentioned structure, part of the light of an LED light source 160 passing through the inner space (S) is reflected by the upper reflective surface 132 and exits the lens 110b through an upper portion of the side surface 124 (see, the arrow $L_4$ of FIG. 9). Another part of the light of the LED light source 160 is reflected by an inner surface 142 and exits the lens 110b through a lower portion of the side surface 124 (see, the arrow $L_5$ of FIG. 9). The other part of the light of the LED light source 160, which enters the upper lens unit 130 at a large incident angle after passing through the selective transmission surface 148a, is reflected by the inside reflective surface 126 and, thereafter, is reflected by the upper reflective surface 132, and exits the lens 110b through the side surface 124 (see, the arrow $L_6$ of FIG. 9).

As such, because the central portion of the lower surface 136 of the upper lens unit 130 protrudes towards the selective transmission surface 148a to form the protruding surface 136b, the lens 110b of FIG. 9 reduces problems wherein light having a large incident angle directly exits the lens unit 10b without being reflected by the upper reflective surface 132, or light exits the lens 110b in an unexpected direction by being incident upon the upper reflective surface 132 at a large angle. Furthermore, due to the inside surface 126 formed by protruding the central portion of the lower surface 136 of the upper lens unit 130, even when the LED light source 160 has a relatively wide emission surface, that is, even when light is incident upon the upper lens unit 130 at a large incident angle, the light efficiently exits the lens 110b through the side surface 124 (see, the arrow $L_6$ of FIG. 9).

Figure 10A:
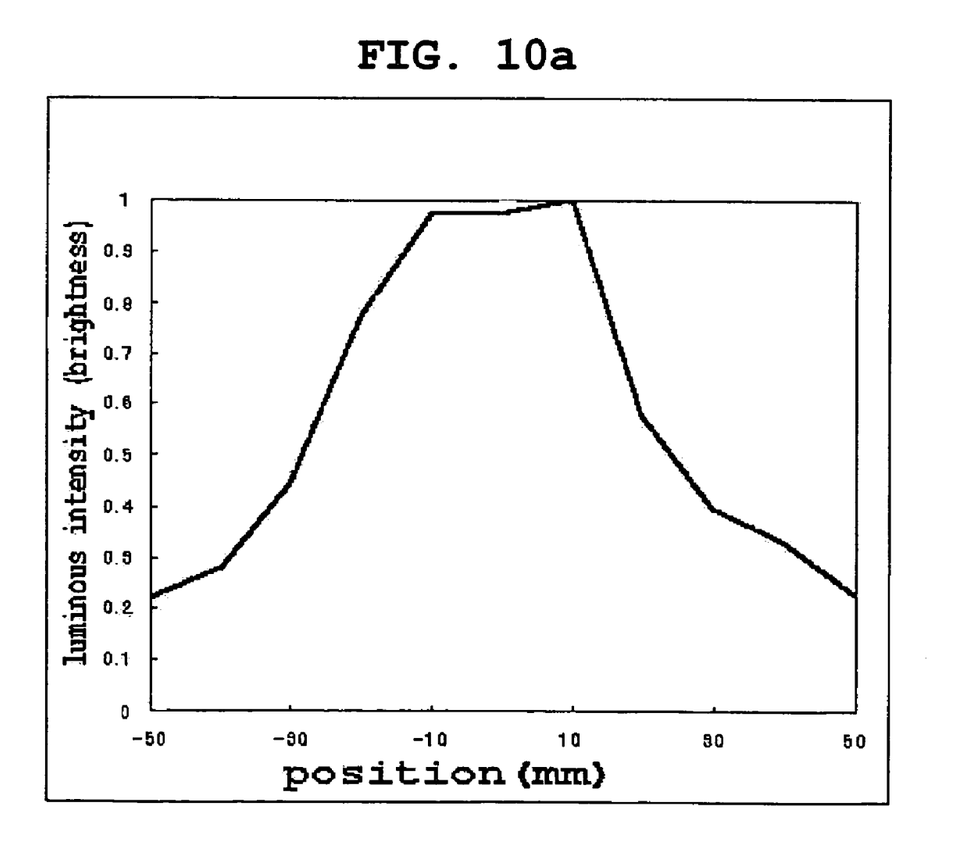
FIGS. 10a through 10c are graphs comparatively showing brightness variation according to the lens shapes of FIGS. 4, 8 and 9.
Figure 10B:
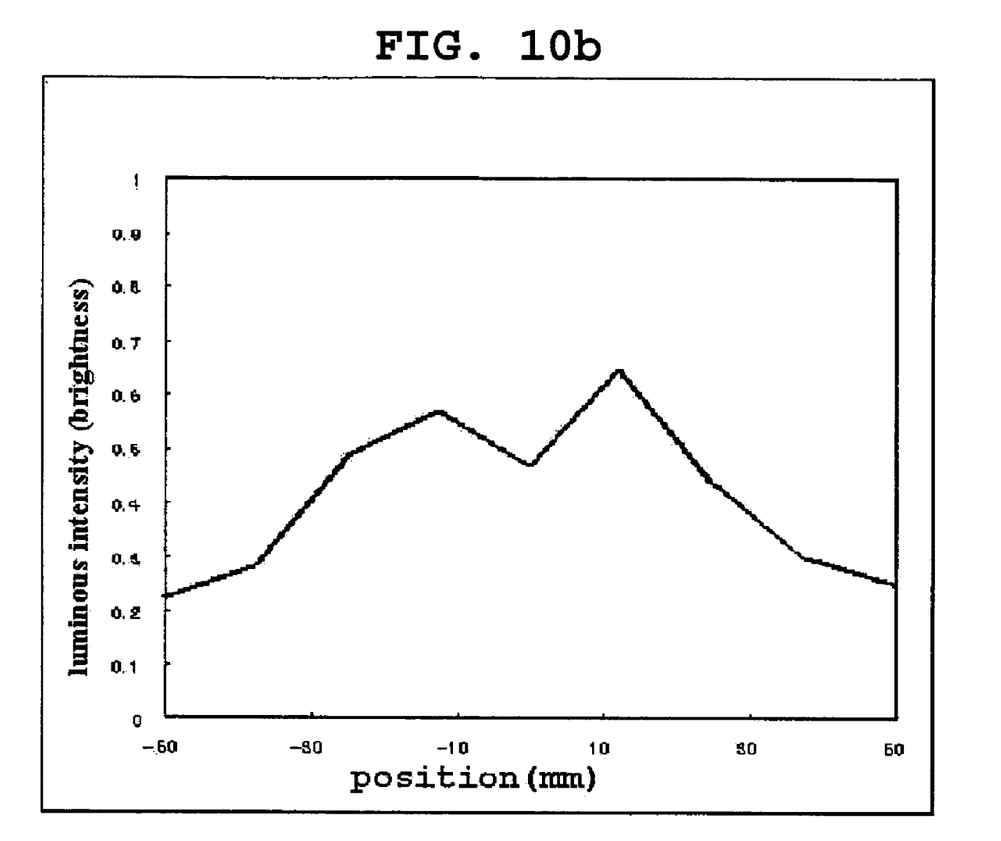
Figure 10C:
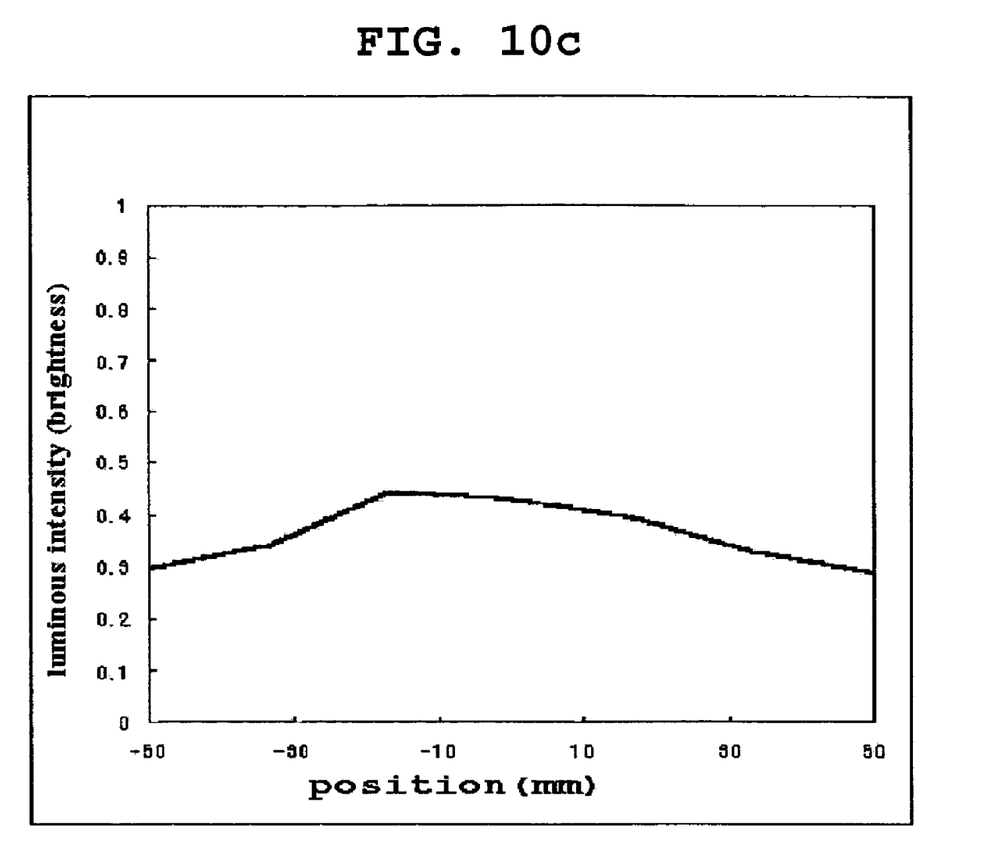

FIGS. 10a through 10c are graphs comparatively showing the variation in brightness in the cases of using the lenses 110, 110a and 110b of FIGS. 4, 8 and 9, respectively, when coupled to the same specific LED light source. The brightness (luminous intensity) of the light of each lens 110, 110a and 110b was measured as a function of the distance from the lens 110, 110a, 110b on the view above (based on X-plane) and the result is expressed in the graphs. The graphs comparatively show variation in brightness according to the shapes of lenses 110, 110a and 110b of FIGS. 4, 8 and 9 in the same conditions using the same measuring equipment. The maximum brightness is set as a reference numeral '1', and other measuring values are shown as approximate values based on the maximum brightness.

Referring to FIG. 10a, the brightness of a region adjacent to the center of the lens (0 point on a position axis) is about 1. The brightness of a region around the circumference of the lens (±40 points on the position axis) is about 0.25. In contrast to this, in FIG. 10b, the brightness of a region adjacent to the center of the lens (0 point on a position axis) is about 0.6. The brightness of a region around the circumference of the lens (±40 points on the position axis) is about 0.25. The variation in brightness between the center of the lens and the circumference is reduced, compared with the case of FIG. 10a. In FIG. 10c, the brightness of a region adjacent to the center of the lens (0 point on a position axis) is about 0.4. The brightness of a region around the circumference of the lens (±40 points on the position axis) is about 0.27. The variation in brightness between the center of the lens and the circumference is the lowest.

As such, with the same specific LED light source, the brightness can vary according to the shape of the lens, in detail, according to the shape of the inner space defined in the lens. Of course, the present invention can be set such that light emitted from the LED light source is evenly diffused from the lens to adjacent regions.

Figure 11:
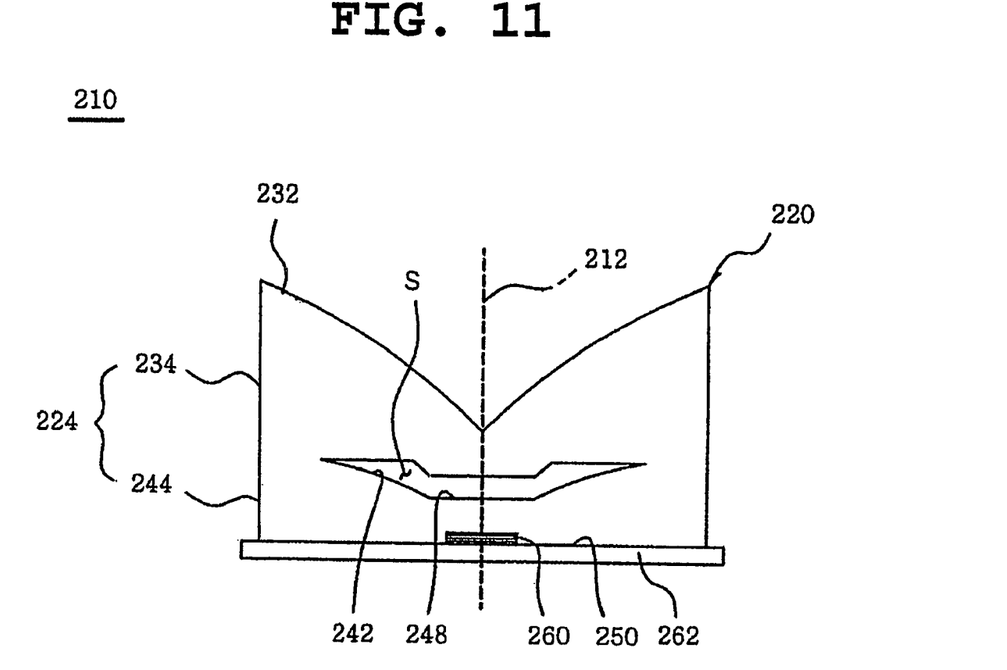
FIG. 11 is a sectional view of a lens for LED light sources, according to another embodiment of the present invention.

FIG. 11 is a sectional view of a lens 210 for LED light sources, according to another embodiment of the present invention. The lens 210 includes a lens body 220. The lens body 220 has a bottom surface 250 which is in close contact with a substrate 262 to which an LED light source 260 is attached. The lens body 220 further has an upper reflective surface 232 which is symmetrical around a center axis 212 of the lens 210 and angled with respect to the center axis 212. The lens body 220 further has a side surface 224 which extends from an edge of the upper reflective surface 232 to an edge of the bottom surface 250. The lens 210 further includes an inner space (S) which is defined in the lens body 220. A lower boundary surface of the inner space (S) forms both an inner reflective surface 242 and a selective transmission surface 248. The lower boundary surface of the inner space (S) reflects or transmits light emitted from the LED light source 260. Light reflected by the upper reflective surface 232 exits the lens 210 through an upper side surface 234 of the side surface 224. Light reflected by the selective transmission surface 248 or the inner reflective surface 242 exits the lens 210 through a lower side surface 244 of the side surface 224.

The lens 210 having the above-mentioned structure is similar to the lens 110 according to the previous embodiment except for the lower reflective surface 146 (see, FIG. 4). In the lens 210 according to the present embodiment, a protruding surface of a lower lens unit has a specific shape to compensate for the elimination of the lower reflective surface. The LED light source 260 is coupled to the bottom surface 250 by being inserted into a coupling depression (not shown) formed on a central portion of the bottom surface 250, and further explanation is deemed unnecessary.

Figure 12:
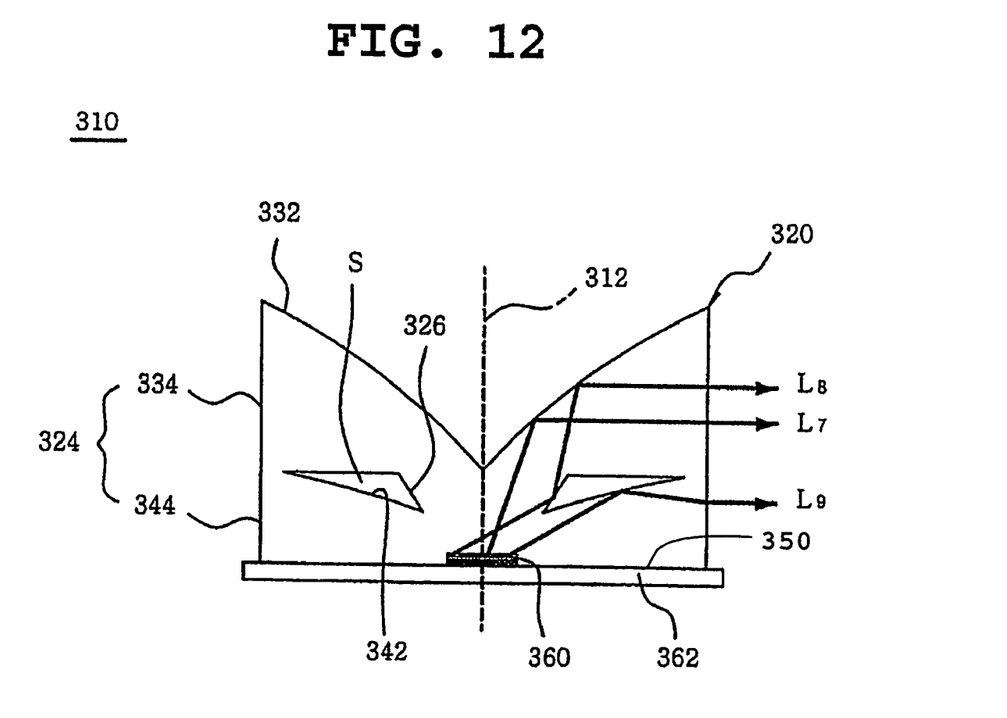
FIG. 12 is a sectional view of a lens for LED light sources, according to yet another embodiment of the present invention.

Next, FIG. 12 is a sectional view of a lens 310 for LED light sources, according to yet another embodiment of the present invention. The lens 310 includes a lens body 320. The lens body 320 has a bottom surface 350 which is in close contact with a substrate 362 to which an LED light source 360 is attached. The lens body 320 further has an upper reflective surface 332 which is symmetrical around a center axis 312 of the lens 310 and angled with respect to the center axis 312. The lens body 320 further has a side surface 324 which extends from an edge of the upper reflective surface 332 to an edge of the bottom surface 350. The lens 310 further includes an inner space (S) which is defined in the lens body 320.

As shown in FIG. 12, the lens 310 according to the present embodiment is characterized in that the inner space (S) is configured as a ring shape. In detail, a part of the lens body 320, through which the center axis 312 of the lens 310 passes, is integrated vertically. The inner space (S) is defined around the integrated center part of the lens body 320 in the ring shape. In the present embodiment, an inside boundary surface of the inner space (S) facing the center axis 312 of the lens 310 serves as an inside reflective surface 326. A lower boundary surface of the inner space (S) serves as an inner reflective surface 342.

In the lens 310 having the above-mentioned structure, part of the light from the LED light source 360, which strikes the upper reflective surface 332 through the integrated center part inside the ring-shaped inner space (S), is reflected by the upper reflective surface 332 and exits the lens 310 through an upper side surface 334 of the side surface 324 (see, the arrow $L_7$ of FIG. 12). Another part of the light emitted from the LED light source 360 is sequentially reflected by the inside reflective surface 326 and the upper reflective surface 332 and exits the lens 310 through the upper side surface 334 (see, the arrow $L_8$ of FIG. 12). The other part of the light emitted from the LED light source 360 is reflected by the inner reflective surface 342 and exits the lens 310 through a lower side surface 344 of the side surface 324 (see, the arrow $L_9$ of FIG. 12).

In the present invention as described above, the inner space is defined in the lens body, so that the boundary surfaces of the inner space serve as the reflective surfaces. Thus, light emitted from the LED light source efficiently exits the lens through the side surface.

Furthermore, although it is not described in the embodiments, in the coupling of the upper and lower lens units, an additional intermediate lens unit may be interposed between the upper lens unit having the upper reflective surface and the lower lens unit having the bottom surface. It is obvious that an additional reflective surface is formed by the intermediate lens unit.

However, in this case, because some light passes through the thick medium which comprises the lower, intermediate and upper lens units, a user must consider light losses due to a reduction in light efficiency of the lens.

As such, the lens for LED light sources according to the present invention is capable of forming a regular illumination field on a large screen, thus being used in display and illumination optical systems more efficiently.

As described above, the present invention provides a lens for LED light sources in which an inner space is defined in a lens body having both a bottom surface and an upper reflective surface, so that light passing through the inner space is reflected by total internal reflection on a portion of a boundary surface between the inner space and the lens body, thus allowing light emitted from an LED light source to efficiently exit the lens through a side surface. Accordingly, the lens of the present invention is used in efficient display and illumination optical systems.

Although the embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A lens for LED (light emitting diode) light sources, comprising:
   a lens body defining an inner space therein and the inner space is symmetrical about a center axis of the lens, comprising:
   a bottom surface;
   an upper reflective surface symmetrical about the center axis of the lens and angled with respect to the center axis;
   a side surface extending from an edge of the upper reflective surface to an edge of the bottom surface; and
   an inner reflective surface provided on at least a portion of a boundary surface of the inner space, symmetrical about the center axis of the lens and inclined at a predetermined angle, so that light entering the lens from an LED light source through the bottom surface is reflected by the upper reflective surface or the inner reflective surface and exits the lens through the side surface in a direction substantially perpendicular to the center axis of the lens.

2. The lens as set forth in claim 1, further comprising:
   a lower reflective surface having a predetermined curvature and provided on a part of the bottom surface separate from the bottom surface through which the light of the LED light source enters the lens, and wherein the lower reflective surface is symmetrical about the center axis of the lens, so that light reflected by the inner reflective surface is reflected by the lower reflective surface and exits the lens through the side surface.

3. The lens as set forth in claim 1, wherein the inner space comprises a region through which the center axis of the lens passes, the lens further comprising:
   a selective transmission surface provided on a central portion of a lower boundary surface of the inner space to reflect part of the light entering the lens through the bottom surface.

4. The lens as set forth in claim 3, wherein the selective transmission surface is perpendicular to the center axis of the lens.

5. The lens as set forth in claim 3, wherein the selective transmission surface is dome shaped, and wherein the dome shape is curved toward the upper reflective surface.

6. The lens as set forth in claim 1, wherein the inner space has a ring shape in a part separate from a region through which the center axis of the lens passes, the lens further comprising:
   an inside reflective surface, provided on an inside boundary surface of the inner space, symmetrical about the center axis of the lens and inclined at a predetermined angle, so that light entering the lens through the bottom surface is reflected by the inside reflective surface and the upper reflective surface and exits the lens through the side surface.

7. The lens as set forth in claim 6, further comprising:
   a lower reflective surface having a predetermined curvature and provided on a part of the bottom surface separate from the bottom surface through which the light of the LED light source enters the lens, and wherein the lower reflective surface is symmetrical about the center axis of the lens, so that light reflected by the inner reflective surface is reflected by the lower reflective surface and exits the lens through the side surface.

8. A lens for LED (light emitting diode) light sources, comprising:

a lower lens unit having a bottom surface coupled to an LED light source; and an upper lens unit coupled to the lower lens unit, comprising an upper reflective surface symmetrical about a center axis of the lens and angled with respect to the center axis, wherein the upper lens unit and the lower lens unit are coupled to define between them an inner space symmetrical about the center axis of the lens, and at least a portion of an upper surface of the lower lens unit in contact with the inner space, forms an inner reflective surface symmetrical about the center axis of the lens and inclined at a predetermined angle, so that light entering the lens from the LED light source through the bottom surface is reflected by the upper reflective surface and exits the lens through the upper lens unit in a direction substantially perpendicular to the center axis of the lens, and light entering the lens from the LED light source through the bottom surface is reflected by the inner reflective surface and exits the lens through the lower lens unit in a direction substantially perpendicular to the center axis of the lens.

9. The lens as set forth in claim 8, wherein the light in the lens is reflected by a total internal reflection.

10. The lens as set forth in claim 9, further comprising:
at least one protrusion and one corresponding stopper provided on a lower surface of the upper lens unit and the upper surface of the lower lens unit, to couple the upper lens unit and the lower lens unit by engagement of the protrusion and the stopper.

11. The lens as set forth in claim 10, wherein the protrusion and the stopper are bonded together by an adhesive material interposed in between, and wherein the adhesive material has a refractive index equal to a refractive index of the upper and the lower lens units.

12. The lens as set forth in claim 8, further comprising:
a selective transmission surface provided on a central portion of the upper surface of the lower lens unit that reflects light entering the lens from the LED light source through the bottom surface.

13. The lens as set forth in claim 12, further comprising:
a lower reflective surface having a predetermined curvature and provided on the bottom surface of the lower lens unit, wherein the lower reflective surface is symmetrical about the center axis of the lens and reflects light reflected by the selective transmission surface.

14. The lens as set forth in claim 13, wherein the selective transmission surface is perpendicular to the center axis of the lens.

15. The lens as set forth in claim 13, wherein the selective transmission surface is dome shaped, and wherein the dome shape is curved toward the upper reflective surface.

16. A lens for LED (light emitting diode) light sources, comprising:
a lower lens unit having a bottom surface coupled to an LED light source;

an upper lens unit coupled to the lower lens unit, comprising an upper reflective surface symmetrical about a center axis of the lens and angled with respect to the center axis, wherein the upper lens unit and the lower lens unit are coupled to define between them an inner space having a ring shape; and an inside reflective surface provided on an inside boundary surface of the inner space, so that part of light entering the lens from the LED light source through the bottom surface is reflected by the inside reflective surface and exits the lens in a direction substantially perpendicular to the center axis of the lens.

17. The lens as set forth in claim 16, wherein the light reflected by the inside reflective surface is reflected by the upper reflective surface of the upper lens and exits the lens in a direction substantially perpendicular to the center axis of the lens.

* * * * *